(12) United States Patent
Amanai et al.

(10) Patent No.: US 8,004,902 B2
(45) Date of Patent: Aug. 23, 2011

(54) NONVOLATILE SEMICONDUCTOR MEMORY DEVICE

(75) Inventors: Masakazu Amanai, Kawasaki (JP);
Masahiko Kashimura, Kawasaki (JP);
Yoshihiro Nagai, Kawasaki (JP);
Masato Taki, Nishikamo-gun (JP);
Norihiro Honda, Toyota (JP); Kazushi Yamanaka, Ichinomiya (JP)

(73) Assignees: Renesas Electronics Corporation, Kanagawa (JP); Toyota Jidosha Kabushiki Kaisha, Aichi-ken (JP)

( * ) Notice: Subject to any disclaimer, the term of this patent is extended or adjusted under 35 U.S.C. 154(b) by 91 days.

(21) Appl. No.: 12/619,952

(22) Filed: Nov. 17, 2009

(65) Prior Publication Data
US 2010/0124125 A1      May 20, 2010

(30) Foreign Application Priority Data
Nov. 17, 2008    (JP) ................... 2008-293225

(51) Int. Cl.
*G11C 16/06* (2006.01)
*G11C 16/04* (2006.01)
*G11C 5/14* (2006.01)

(52) U.S. Cl. ........... 365/185.21; 365/185.18; 365/185.2; 365/185.23; 365/189.09

(58) Field of Classification Search ............... 365/185.21
See application file for complete search history.

(56) References Cited

U.S. PATENT DOCUMENTS

| 6,026,023 | A  | * | 2/2000  | Tonda ............ 365/185.2    |
| 6,097,639 | A  | * | 8/2000  | Choi et al. ....... 365/185.28  |
| 7,495,955 | B2 | * | 2/2009  | Ido ............... 365/185.02  |
| 2009/0296484 | A1 | * | 12/2009 | Wang et al. ...... 365/185.18 |

FOREIGN PATENT DOCUMENTS

JP      2004-178621 A      6/2004

* cited by examiner

*Primary Examiner* — Son L Mai
(74) *Attorney, Agent, or Firm* — Sughrue Mion, PLLC

(57) ABSTRACT

A nonvolatile memory device includes a memory cell that stores data by presence or absence of electrons accumulated in a floating gate, a read reference current generator that generates a read reference current for reading data from the memory cell based on a constant current from a constant current generator included therein, and a read voltage generator that generates a read voltage to be applied to a control gate of the memory cell during data reading. The read reference current generator generates a monitor voltage that varies according to variation of the read reference current and a threshold voltage of the memory cell. The read voltage generator generates the read voltage based on the monitor voltage.

6 Claims, 11 Drawing Sheets

NONVOLATILE SEMICONDUCTOR MEMORY DEVICE

BACKGROUND OF THE INVENTION

1. Field of the Invention

The present invention relates to a nonvolatile semiconductor memory device.

2. Description of Related Art

A flash memory and an EEPROM (Erasable Programmable Read Only Memory) are known as nonvolatile semiconductor memory devices. A memory cell of such a nonvolatile semiconductor memory device includes a control gate and a floating gate, and stores data by the presence or absence of electrons accumulated in the floating gate.

In order to stably read information stored in a memory cell, a structure is known which incorporates a dummy cell that is identical to the memory cell and uses an output from the dummy cell as a reference (e.g. Japanese Unexamined Patent Publication No. 2004-178621).

FIG. 9 is a circuit structure of the flash memory disclosed in Japanese Unexamined Patent Publication No. 2004-178621. Referring to FIG. 9, a flash memory 30 includes a memory cell 31, a reference cell (dummy cell) 32, control transistors 33 and 34 and a decision amplifier 35.

The symbols Vcc and Vss in FIG. 9 indicate a voltage source potential (generally, 5V) and a ground potential (generally, 0V), respectively.

When the memory cell 31 is selected by a word line, a read voltage Vwl is applied to a control gate of the memory cell 31 through the word line.

The read voltage Vwl being applied to the control gate, a memory cell current Icell corresponding to charges accumulated in a floating gate is output from the memory cell 31.

FIG. 10(A) is a view showing an example of I-V characteristics of the memory cell.

In FIG. 10(A), the I-V characteristics of the memory cell in written mode and the I-V characteristics of the memory cell in erased mode are both shown.

As shown in FIG. 10(A), the memory cell is designed in such a way that there is a sufficient difference between a current $Icell_1$ output from the memory cell in written mode and a current $Icell_0$ output from the memory cell in erased mode when a read voltage is applied.

The memory cell current Icell is supplied to the decision amplifier 35 through the control transistor 33, and information is read by the decision amplifier 35 based on the memory cell current Icell.

The decision amplifier 35 is connected to a bit line 36 and a reference bit line 37, and compares the magnitudes of a current Icell passing through the bit line 36 and a current Iref passing through the reference bit line 37.

The reference cell 32 is used to supply a reference current Iref to the decision amplifier 35.

FIG. 10(B) is view showing an example of I-V characteristics of the reference cell.

The reference cell is set in such a way that the magnitude of the reference current Iref that flows when a voltage Vcc is applied is between the current value $Icell_1$ output from the memory cell in written mode and the current value $Icell_0$ output from the memory cell in erased mode.

Such setting of the reference cell is made by controlling the charges accumulated in the floating gate or the voltage value Vcc applied to the reference cell.

The decision amplifier 35 can determine the data stored in the memory cell 31 by comparing the current Icell passing through the bit line 36 and the current Iref passing through the reference bit line 37.

At this point, a sufficient difference is made between the current value ($Icell_0$, $Icell_1$) output from the memory cell 31 and the reference current Iref, so that a sufficient operating margin is maintained to secure the reading operation.

Because the memory cell 31 and the reference cell 32 have the identical structure, the relative relationship between the I-V characteristics of the memory cell 31 and the I-V characteristics of the reference cell 32 is stable, and normal reading of data is assured.

SUMMARY

With the recent widespread use of nonvolatile semiconductor memory, a temperature range to be assured tends to expand. For example, in the nonvolatile semiconductor memory that is used for a vehicle-mounted microcomputer, stable operation over a wide temperature range is desired.

However, it has now been discovered that in the above-described nonvolatile semiconductor memory device shown in FIG. 9, it is not always possible to secure the operation under wide environment conditions.

In the nonvolatile semiconductor memory device shown in FIG. 9, although the relationship of the I-V characteristics of the memory cell 31 and the reference cell 32 is stable because they have the same structure, the read voltage Vwl and the voltage Vcc applied to the respective cells are generated in different circuits and thus power supply voltage dependence and temperature dependence are different.

If the read voltage Vwl and the reference applied voltage Vcc are affected by different temperature dependence or power supply voltage dependence, the relationship between the memory cell current value ($Icell_0$, $Icell_1$) and the reference current value Iref fluctuates.

For example, if the reference applied voltage Vcc varies at a higher rate than the read voltage Vwl, the reference current value varies with the reference applied voltage.

FIG. 11 is a view showing the case where the reference applied voltage Vcc increases and the reference current value increases accordingly. In this case, a gap $\Delta g$ between the reference current Iref and the memory cell current ($Icell_0$) becomes smaller, resulting in read error or becoming inoperative.

As described above, the nonvolatile semiconductor memory device shown in FIG. 9 has a concern that it is incapable of securing the operation over a wide range.

An exemplary aspect of an embodiment of the present invention is a nonvolatile semiconductor memory device which includes a memory cell that includes a floating gate and a control gate and stores data by presence or absence of electrons accumulated in the floating gate, a read reference current generator that generates a read reference current for reading data from the memory cell based on a constant current from a constant current generator included therein, and a read voltage generator that generates a read voltage to be applied to the control gate of the memory cell during data reading, wherein the read reference current generator generates a monitor voltage varying according to variation of the read reference current and a threshold voltage of the memory cell, and the read voltage generator generates the read voltage based on the monitor voltage.

In this structure, the monitor voltage varies according to variation of the read reference current and the memory cell. The read voltage is generated based on the monitor voltage.

Because the read voltage is designed to vary according to variation of the read reference current and the memory cell, variation of a gap between the reference current and the memory cell current is suppressed even if environmental variation or manufacturing variation occurs. It is thereby possible to more reliably assure the secure operation for data reading.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention are illustrated in the accompanying figures and described hereinafter with reference to the symbols designating the respective elements therein.

First Exemplary Embodiment

A nonvolatile semiconductor memory device according to a first exemplary embodiment of the present invention is described hereinbelow.

Figure 1:
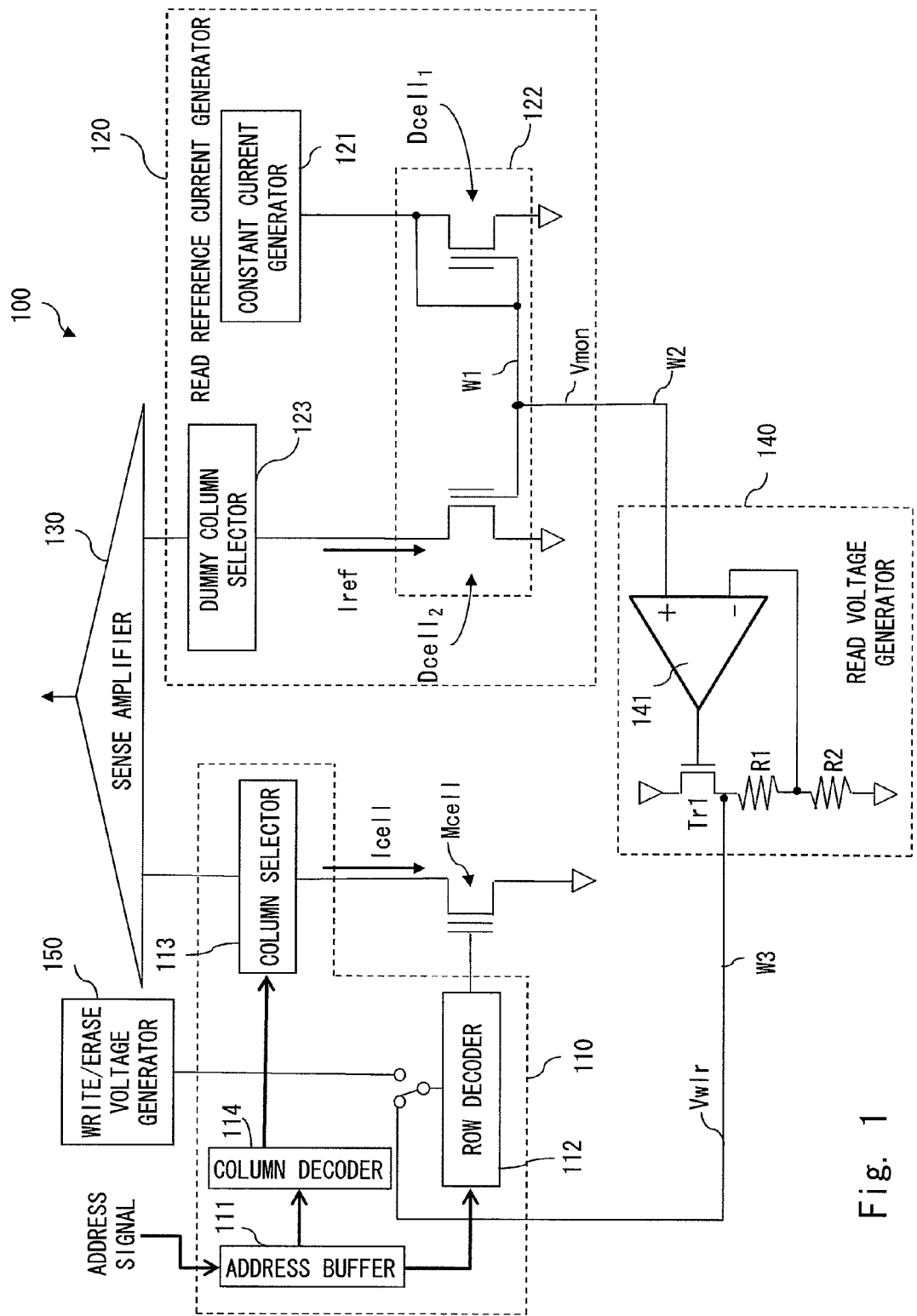
FIG. 1 is a block diagram showing a structure according to a first exemplary embodiment.

FIG. 1 is a block diagram showing a structure according to the first exemplary embodiment.

The first exemplary embodiment is a flash memory device, and FIG. 1 is a view in which a part related to data reading of a memory cell is extracted in the flash memory device.

Although a memory device includes a write circuit for data writing and an erase circuit for data erasing, detailed explanation of the structure for writing and erasing is omitted because an existing structure can be employed.

A flash memory device 100 includes a memory cell Mcell, a memory cell selection unit 110, a read reference current generator 120, a sense amplifier 130 and a read voltage generator 140.

The memory cell Mcell includes a floating gate and a control gate, and stores data by the presence or absence of electrons accumulated in the floating gate.

Although only one memory cell Mcell is illustrated as a representative in FIG. 1, a plurality of cells are arranged in matrix in actuality.

Figure 2:
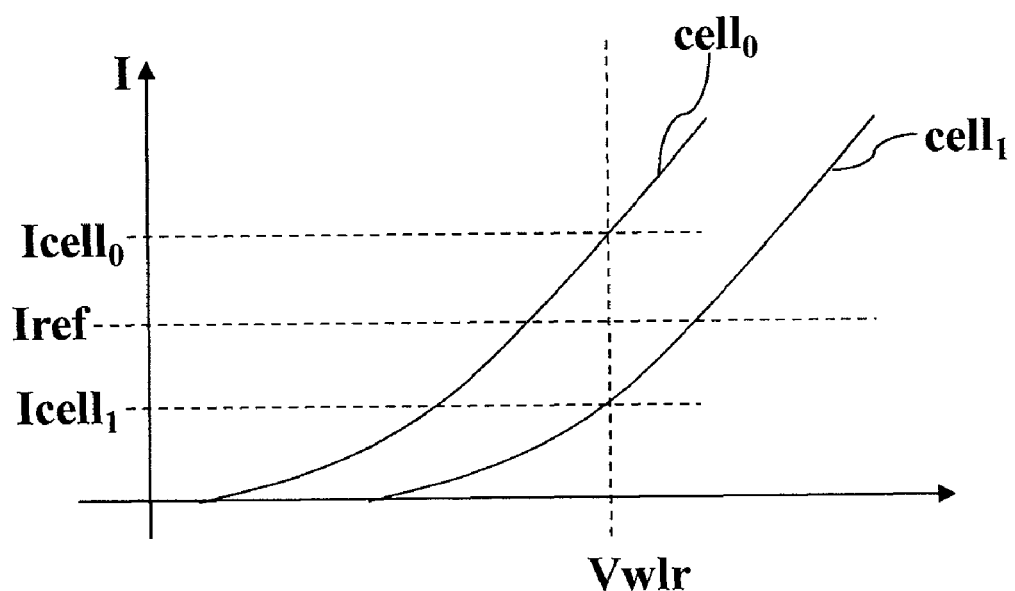
FIG. 2 is view showing I-V characteristics of a memory cell.

Referring to FIG. 2, the memory cell Mcell is designed in such a way that there is a sufficient difference between a current $Icell_1$ output from the memory cell Mcell in written mode and a current $Icell_0$ output from the memory cell Mcell in erased mode when a read voltage Vwlr is applied.

The memory cell selection unit 110 includes an address buffer 111, a row decoder 112, a column selector 113 and a column decoder 114.

An input address signal is output from the address buffer 111 to the row decoder 112 and the column decoder 114. The column decoder 114 further outputs address information to the column selector 113. Then, on/off control of switches of the column selector 113 and the row decoder 112 is executed in such a way that the memory cell Mcell as a target for reading is selected based on the address information.

Further, a read voltage Vwlr generated in the read voltage generator 140 or an erase voltage from a write/erase voltage generator 150 is selectively input to the row decoder 112 by the switch.

Because data reading is mainly described in this exemplary embodiment, it is assumed that the read voltage Vwlr from the read voltage generator 140 is input to the row decoder 112, and the row decoder 112 applies the read voltage Vwlr to the control gate of the memory cell Mcell as a target for reading.

Further, a memory cell current Icell is supplied to the sense amplifier 130 through the column selector 113.

The read reference current generator 120 includes a constant current generator 121, a current mirror circuit 122 and a dummy column selector 123.

The current mirror circuit 122 is composed of two dummy cells Dcell having the same structure as and manufactured in the same process as the memory cell Mcell.

A first dummy cell $Dcell_1$ is placed between the constant current generator 121 and a ground power supply, and a second dummy cell $Dcell_2$ is placed between the dummy column selector 123 and the ground power supply.

The dummy cells $Dcell_1$ and $Dcell_2$ respectively include a control gate and a floating gate, and their floating gates are connected through a connection line W1.

Further, a drain of the first dummy cell $Dcell_1$ and the connection line W1 are connected, and the first dummy cell $Dcell_1$ and the second dummy cell $Dcell_2$ form the current mirror circuit 122.

A current supplied from the constant current generator 121 thereby flows into the second dummy cell $Dcell_2$ by the current mirror circuit 122.

This is called a read reference current Iref.

As shown in FIG. 2, the constant current of the constant current generator 121 is set in such a way that the read reference current Iref is between an erased cell current $Icell_0$ and a written cell current $Icell_1$.

The dummy column selector 123 is always in the on-state during the read operation and supplies the read reference current Iref to the sense amplifier 130.

Further, a branch line W2 that branches off the connection line W1 is wired to the read voltage generator 140, and a gate-source voltage of the first dummy cell $Dcell_1$ is supplied as a monitor voltage Vmon to the read voltage generator 140. Thus, the monitor voltage Vmon is a voltage signal that is determined by the current value of the constant current generator 121 and the characteristics of the second dummy cell Dcell$_2$.

The memory cell current Icell of the memory cell Mcell and the reference current Iref from the read reference current generator 120 are input to the sense amplifier 130, and the sense amplifier 130 reads the information of the memory cell Mcell by comparison of the magnitudes of the memory cell current Icell and the reference current Iref.

The read voltage generator 140 includes a non-inverting amplifier 141, a regulator transistor Tr1, a resistor R1 and a resistor R2.

The monitor voltage Vmon is input to a positive-phase input terminal of the non-inverting amplifier 141, and an output is applied to a gate of the regulator transistor Tr1.

The regulator transistor Tr1 is placed between a power supply voltage and a ground power supply. The resistor R1 and the resistor R2 are connected in series between the regulator transistor Tr1 and the ground power supply, and a negative-phase input terminal of the non-inverting amplifier 141 is fed back to a node between the resistor R1 and the resistor R2. Further, a branch line W3 from a node between the regulator transistor Tr1 and the resistor R1 is wired to the row decoder 112, and the read voltage Vwlr is supplied to the row decoder 112 through the branch line W3.

In this structure, the read voltage Vwlr varies depending on variation of the monitor voltage Vmon.

The relationship between the read voltage Vwlr and the monitor voltage Vmon is represented by Vwlr=Vmon×(R1+R2)/R2.

The operation of the flash memory device 100 having the above-described structure is described hereinbelow.

Operation Example 1

First, the operation in the case where the read reference current Iref varies is described.

If the power supply voltage varies due to a change in the environment such as temperature, the constant current value from the constant current generator 121 varies accordingly.

Further, if there is variation during manufacture, the constant current generator 121 sometimes outputs a current value deviated from a specified current value.

The case where the current value from the constant current generator 121 increases due to such a reason is described hereinafter by way of illustration.

If the current value from the constant current generator 121 increases, the read reference current Iref supplied to the sense amplifier 130 by the current mirror circuit 122 increases accordingly. Specifically, the read reference current Iref increases to become Iref' as shown in the arrow (1) in FIG. 3, for example.

Figure 3:
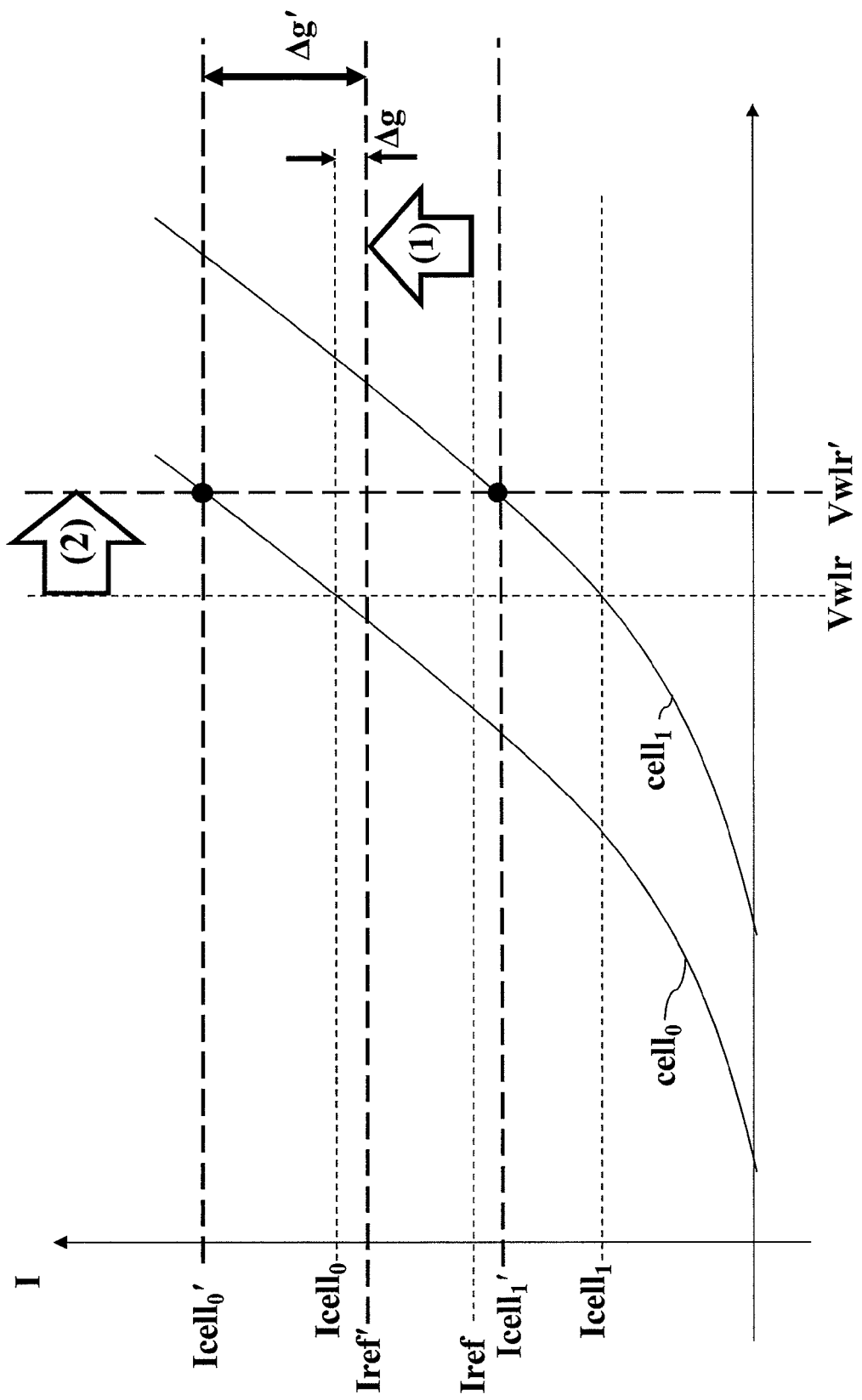
FIG. 3 is a view to describe an operation example 1 according to the first exemplary embodiment.

If the memory cell current Icell does not change when the read reference current increases in this manner, a gap Δg between the memory cell current (which is Icell$_0$ in this example) and the reference current Iref' becomes smaller as shown in FIG. 3, which makes it difficult to secure the operation.

On the other hand, in this exemplary embodiment, the monitor voltage Vmon which is a gate-source voltage of the first dummy cell Dcell$_1$ increases when the read reference current increases due to a change in the current value from the constant current generator 121. The increase in the monitor voltage Vmon leads to an increase in the read voltage Vwlr through the non-inverting amplifier 141 and the regulator transistor Tr1. Specifically, the read voltage Vwlr increases as shown in the arrow (2) in FIG. 3. If the increased read voltage Vwlr is applied from the row decoder 112 to the memory cell Mcell, the memory cell current Icell increases, and the erased cell current becomes Icell$_0$'. Consequently, a gap Δg' between the reference current Iref' and the memory cell current (the erased cell current Icell$_0$') becomes larger. As a result, stable data reading is assured even when the constant current value from the constant current generator 121 varies due to environmental variation or element variation.

Note that, if the read voltage increases to become Vwlr' when the reference current Iref increases to become Iref', the written cell current increases from Icell$_1$ to Icell$_1$'.

If the written cell current Icell$_1$ increases in this manner, the gap (Iref'−Icell$_1$) that is enlarged by the increase in the reference current is narrowed; however, this is in the direction of correcting the gap that is enlarged more than necessary, and the gap (Iref'−Icell$_1$') between the written cell current Icell$_1$' and the read reference current Iref' is maintained sufficiently. Therefore, stable reading can be secured for a written cell as well in this case.

Operation Example 2

Next, the case where memory cell characteristics vary due to manufacturing variation is described by way of illustration.

There are cases where variation occurs during manufacture, such as a gate oxide film of the memory cell Mcell becomes thicker, for example.

Figure 4:
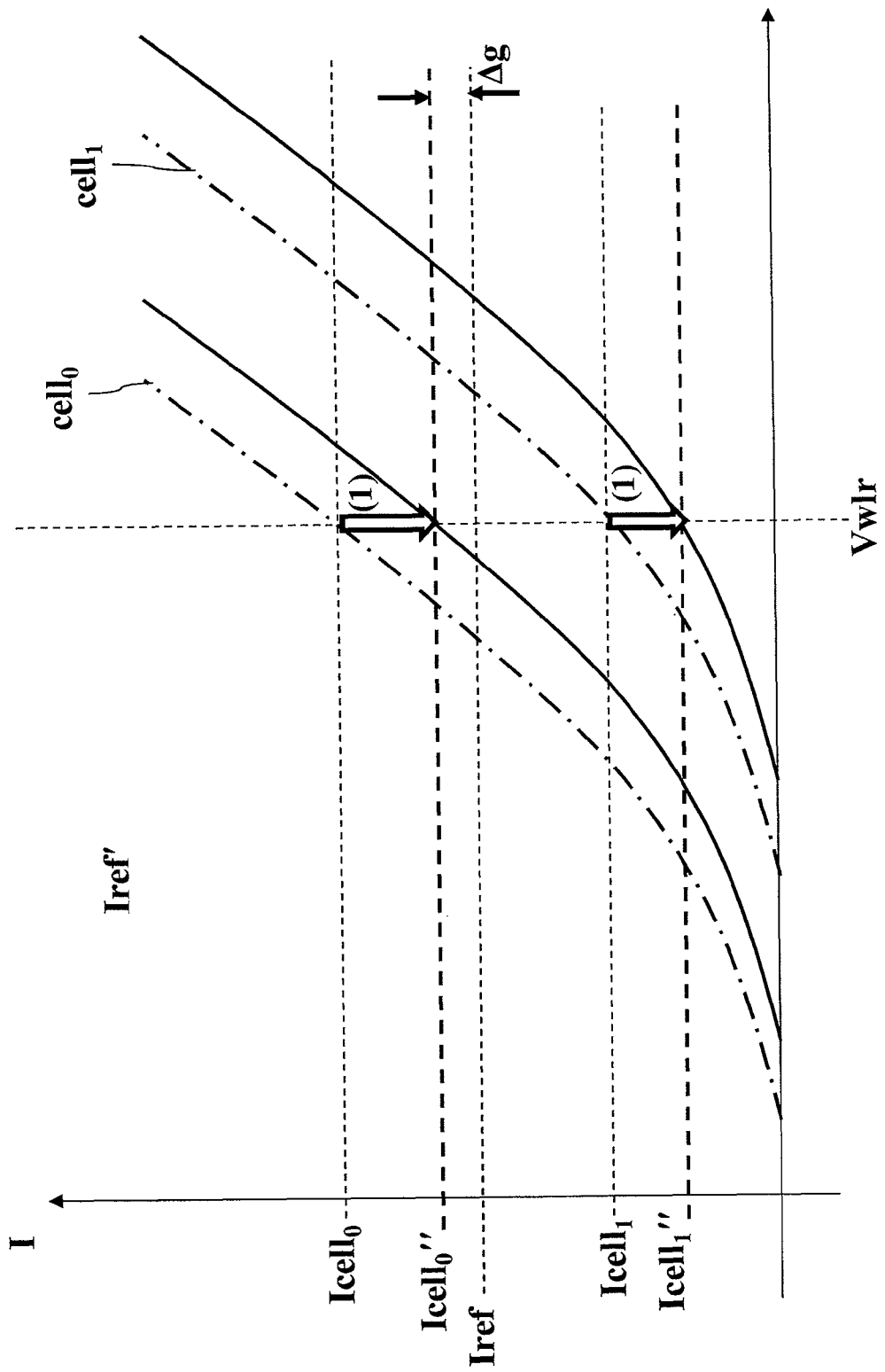
FIG. 4 is a view to describe an operation example 2 according to the first exemplary embodiment.

If write or erase of data is executed with a specified voltage and time on the memory cell Mcell having the gate oxide film that is thicker than the specified thickness, the erased cell current Icell$_0$ and the written cell current Icell$_1$ of the memory cell Mcell both decrease (i.e. the arrow (1) in FIG. 4).

In such a case, if the specified reference current Iref is used as it is, the gap Δg between the reference current Iref and the memory cell current (which is the erased cell current Icell$_0$" in this example) is small, which makes it difficult to secure the operation.

On the other hand, in this exemplary embodiment, because the dummy cell Dcell has the same structure as and manufactured in the same process as the memory cell Mcell, a change in characteristics occurs in the dummy cell Dcell which is the same as a change in characteristics of the memory cell Mcell. Accordingly, the dummy cell Dcell applies a higher monitor voltage Vmon to an applied constant current.

Figure 5:
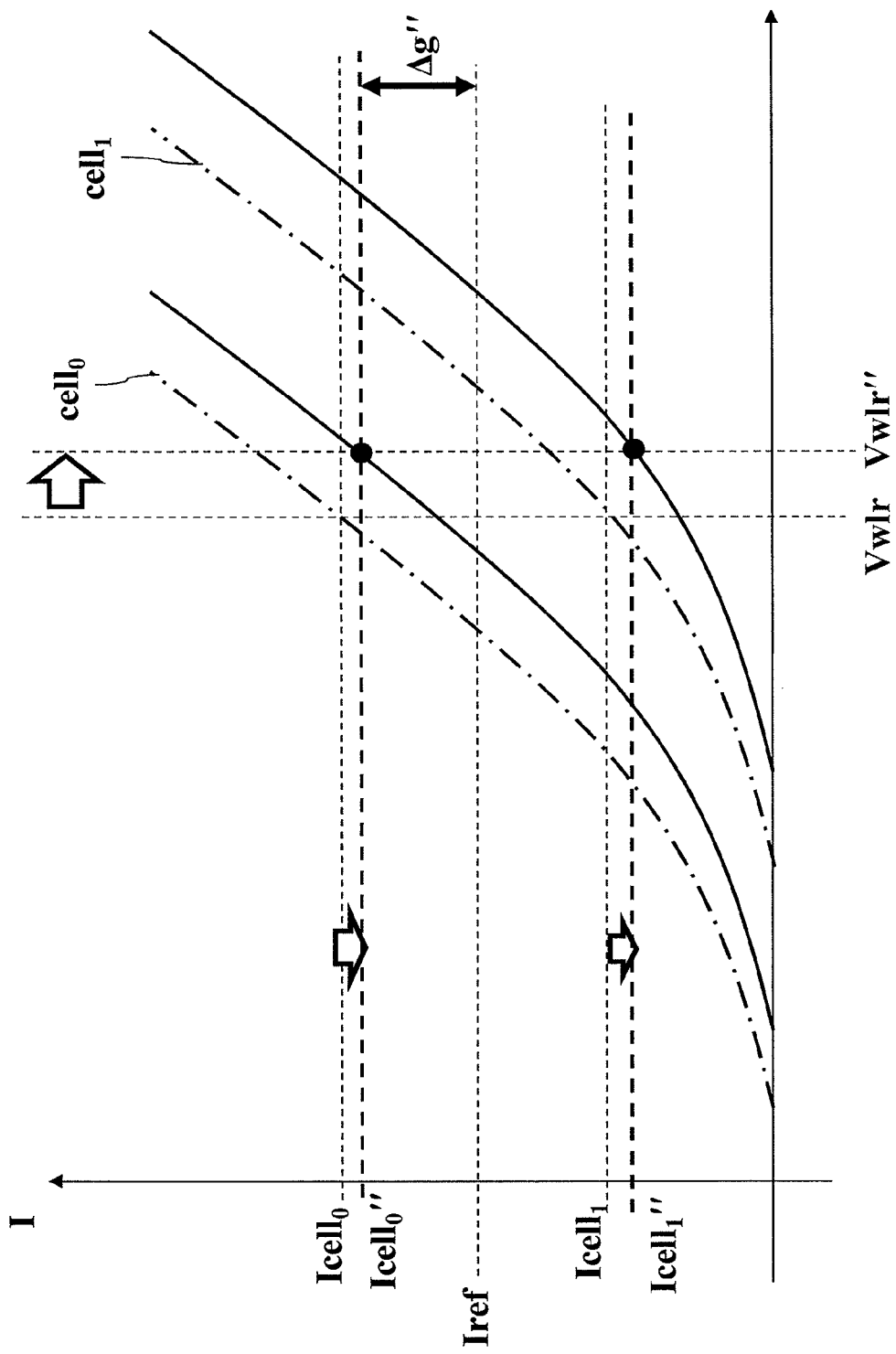
FIG. 5 is a view to describe the operation example 2 according to the first exemplary embodiment.

The increase in the monitor voltage Vmon leads to an increase in the read voltage Vwlr through the non-inverting amplifier 141 and the regulator transistor Tr1. Then, variation of the memory cell current Icell is suppressed, so that the gap from the reference current Iref is maintained to be sufficiently large. This is shown in FIG. 5. As a result, stable data reading is assured even with element variation.

Note that there are other approaches to manufacturing variation of the memory cell, such as lengthening the erase time or raising the erase voltage. However, the performance looks low if the latency time is long, and the measure by raising the erase voltage is insufficient due to limitations imposed on the withstand voltage. In light of this, the structure according to the exemplary embodiment has a significant advantage.

Second Exemplary Embodiment

A second exemplary embodiment of the present invention is described hereinbelow.

Although the basic structure of the second exemplary embodiment is the same as that of the first exemplary embodiment, it has a feature in that the first current mirror circuit for supplying the reference current to the sense amplifier is formed by normal transistors, and the dummy cell for supplying the monitor voltage is placed separately in the read reference current generator.

Figure 6:
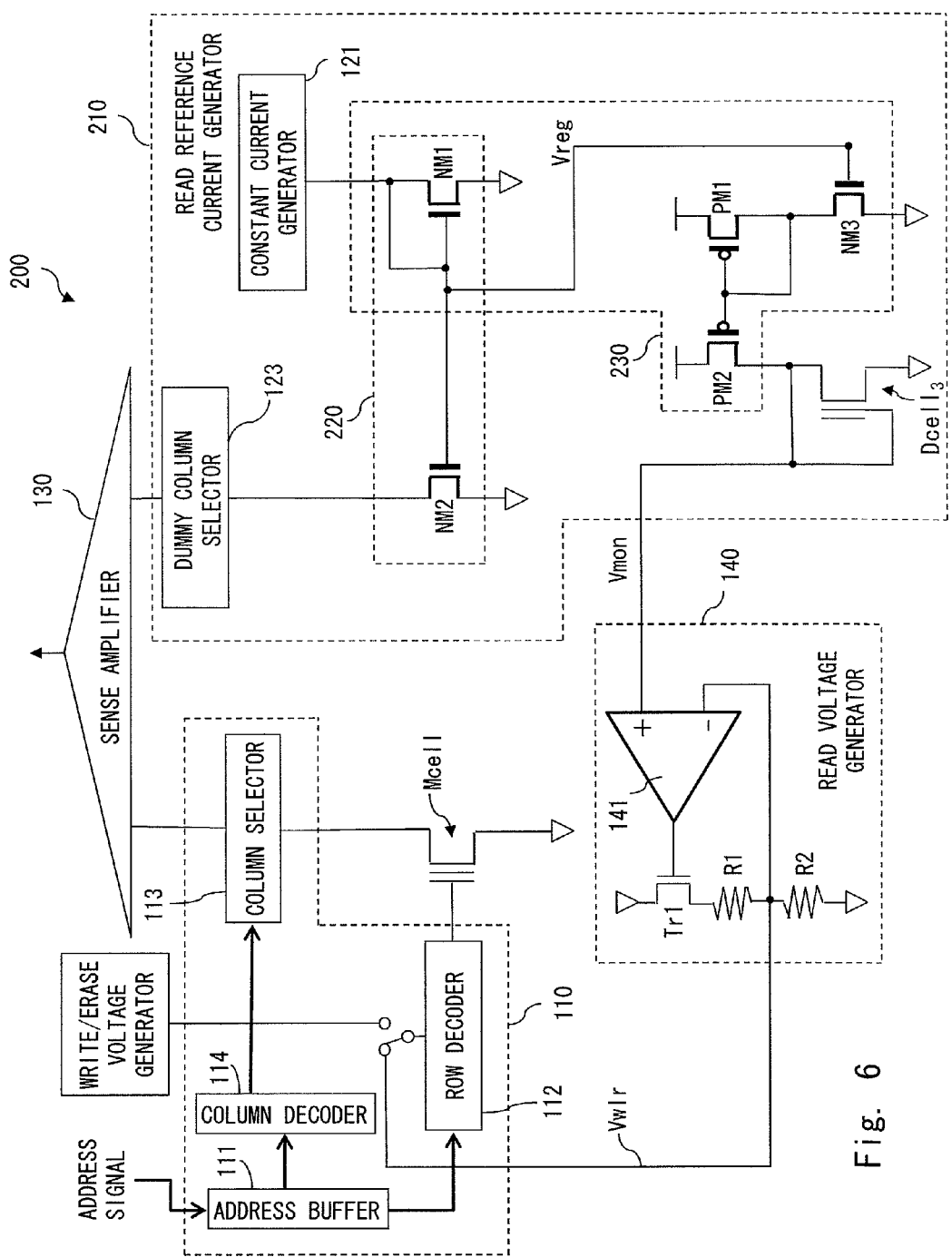
FIG. 6 is a block diagram showing a structure according to a second exemplary embodiment.

FIG. 6 is a view showing a structure according to the second exemplary embodiment.

Referring to FIG. 6, a first current mirror circuit 220 is made up of NM1 and NM2, which are normal nMOS transistors, and a constant current from the constant current generator 121 is supplied to the sense amplifier 130 by the first current mirror circuit 220. Further, a second current mirror circuit 230 that supplies the constant current of the constant current generator 121 to a dummy cell Dcell$_3$ is mounted.

The second current mirror circuit 230 includes two pMOS transistors PM1 and PM2, and two nMOS transistors NM1 and NM3.

The sources of the first pMOS transistor PM1 and the second pMOS transistor PM2 are both connected to the power supply, and their gates are connected to each other. A connection line between the gates is connected to the drain of the first pMOS transistor PM1.

The third nMOS transistor NM3 is connected between the drain of the first pMOS transistor PM1 and the ground power supply, and a regulation voltage Vreg, which is a gate-source voltage of the first nMOS transistor NM1, is applied to the gate of the third nMOS transistor NM3.

The first nMOS transistor NM1 is shared by the first current mirror circuit 220 and the second current mirror circuit 230.

The dummy cell Dcell$_3$ is placed between the second pMOS transistor PM2 and the ground power supply, and its gate-source voltage is supplied as the monitor voltage Vmon to the read voltage generator 140.

In such a structure also, the monitor voltage Vmon can be changed according to the constant current from a constant current generator 121 and the characteristics of the memory cell, thus having the similar functional advantages to the above-described first exemplary embodiment.

Further, because the first current mirror circuit 220 is formed by normal transistors NM1 and NM2, the gate length and the gate width of the transistors can be flexibly designed. This also improves the accuracy of the current mirror. The improvement in the accuracy of the current mirror allows reduction of variation of the read reference current, thereby enlarging a read margin and enabling more secure operation.

The present invention is not limited to the exemplary embodiments described above, and various changes may be made without departing from the scope of the invention.

Although the case where the memory is a flash memory is described in the above exemplary embodiments, the memory cell may be an EEPROM (Electrically Erasable and Programmable Read Only Memory).

In this case, the part serving as the dummy cell in the above-described exemplary embodiments is designed to have the same structure as the EEPROM in accordance with the memory cell.

Figure 7:
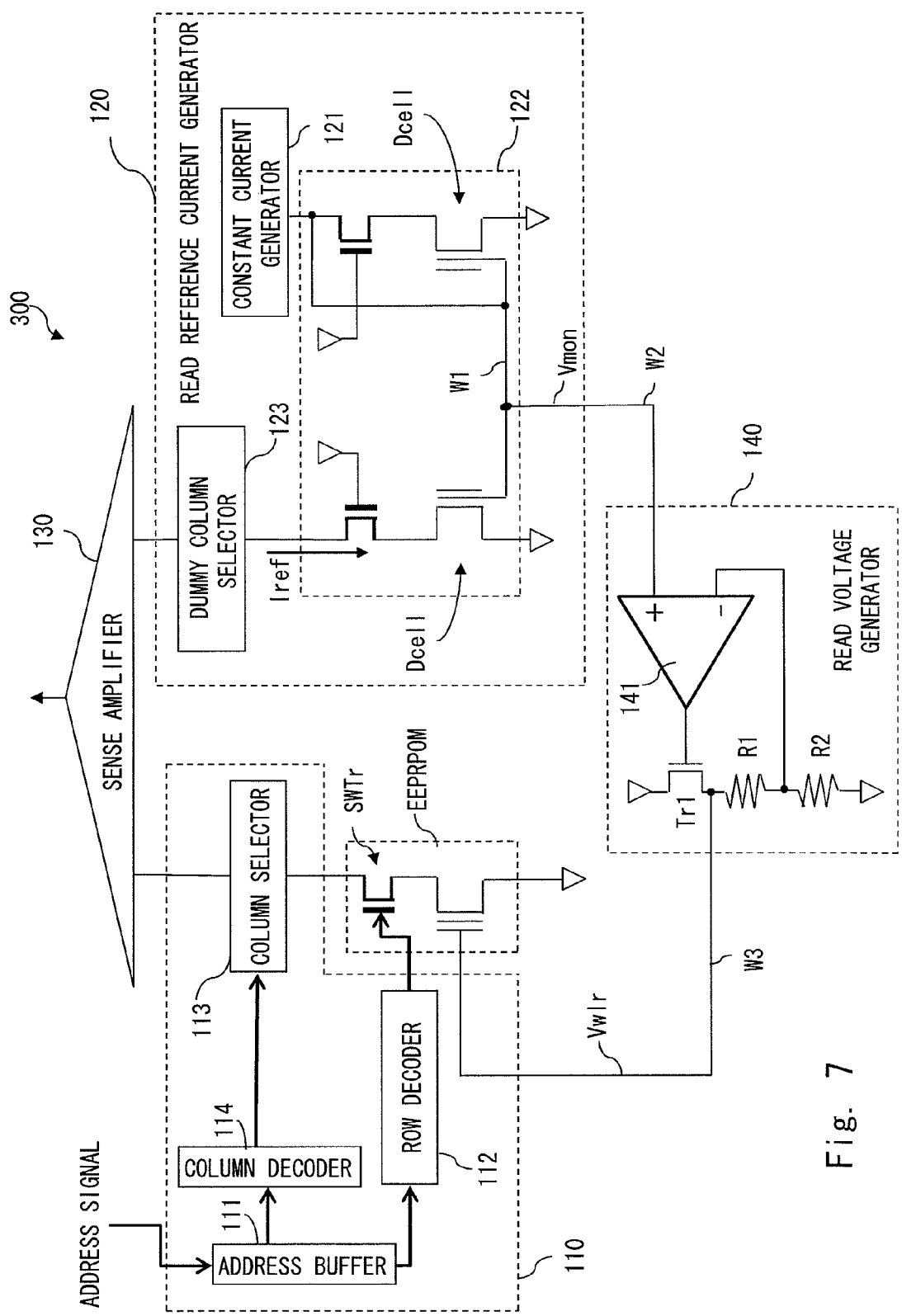
FIG. 7 is a circuit diagram where a memory cell according to the first exemplary embodiment is replaced by an EEPROM.

FIG. 7 is a circuit diagram in the case where the memory cell according to the first exemplary embodiment is replaced by an EEPROM. Because the EEPROM is composed of a switching transistor SWtr and a storage cell, the dummy cell Dcell is also designed to have the same structure.

Figure 8:
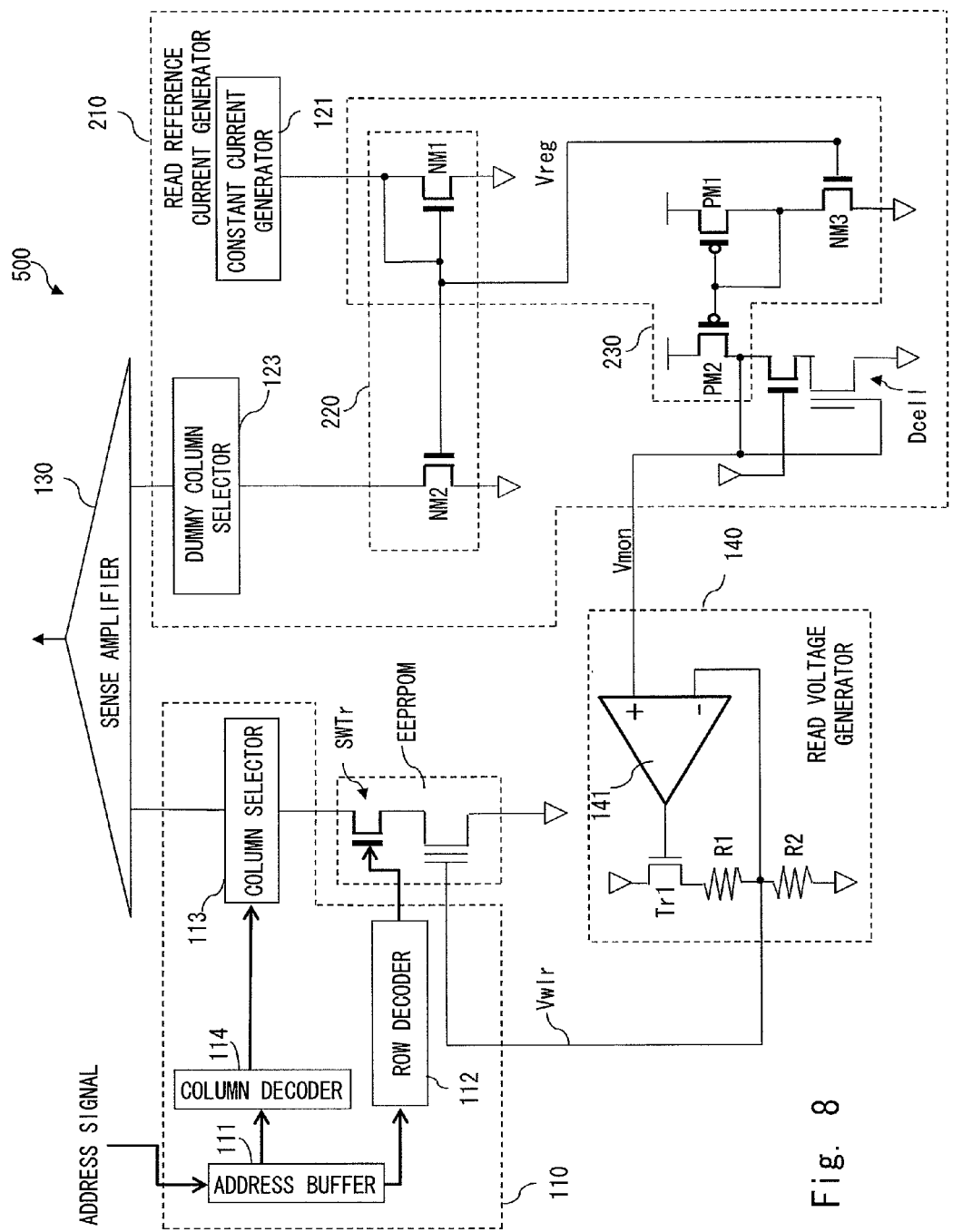
FIG. 8 is a circuit diagram where a memory cell according to the second exemplary embodiment is replaced by an EEPROM.
Figure 9:
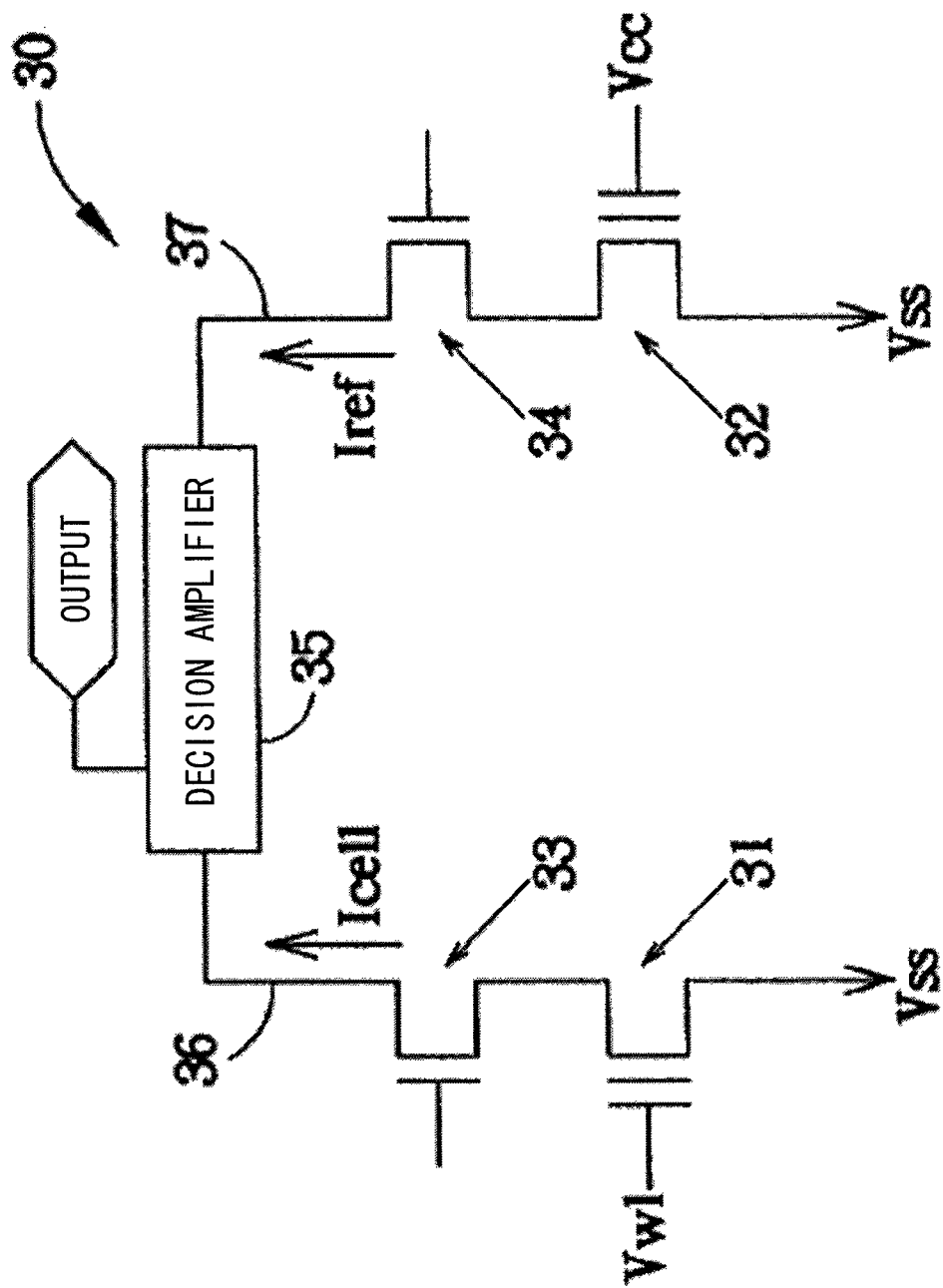
FIG. 9 is a circuit diagram of a flash memory disclosed in Japanese Unexamined Patent Publication No. 2004-178621.
Figure 10:
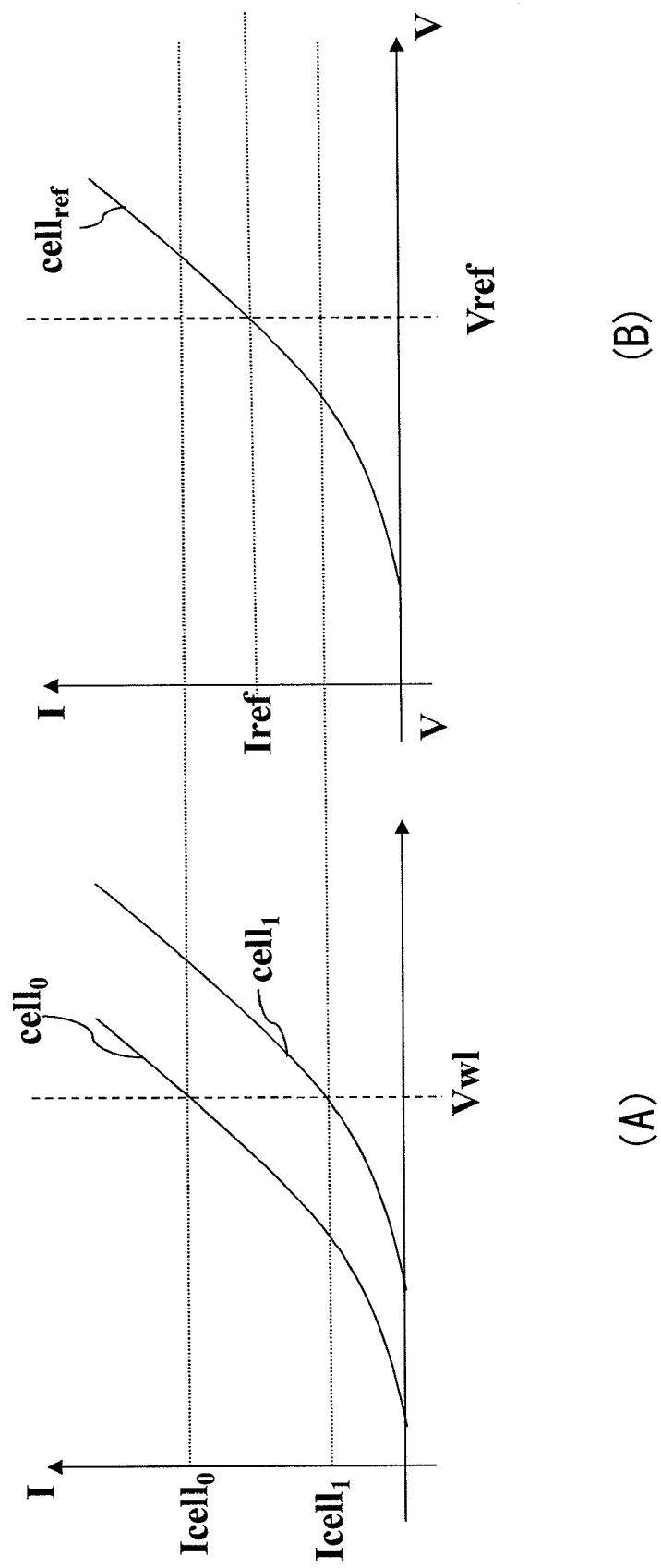
FIG. 10 is a view showing I-V characteristics of a memory cell and a reference cell in a technique disclosed in Japanese Unexamined Patent Publication No. 2004-178621.
Figure 11:
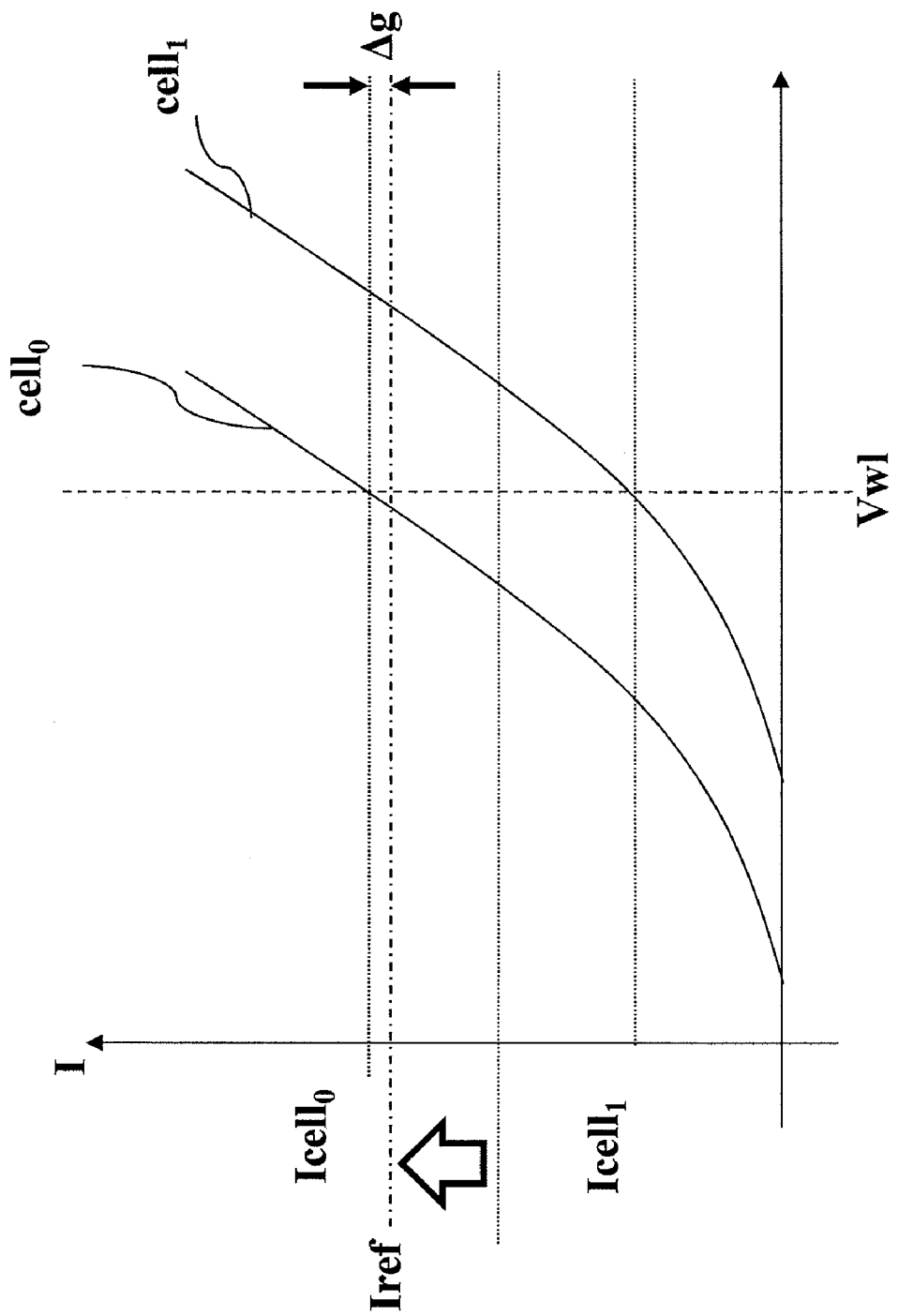
FIG. 11 is a view showing a case where a reference applied voltage Vcc increases and a reference current value increases accordingly in a technique disclosed in Japanese Unexamined Patent Publication No. 2004-178621.

FIG. 8 is a circuit diagram in the case where the memory cell according to the second exemplary embodiment is replaced by an EEPROM. Likewise, the structure of the dummy cell is altered in accordance with the EEPROM.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A nonvolatile memory device comprising:
   a memory cell that includes a floating gate and a control gate, and stores data by presence or absence of electrons accumulated in the floating gate;
   a read reference current generator that generates a read reference current for reading data from the memory cell based on a constant current from a constant current generator included in the read reference current generator; and
   a read voltage generator that generates a read voltage to be applied to the control gate of the memory cell during data reading, wherein
   the read reference current generator generates a monitor voltage varying according to variation of the read reference current and a threshold voltage of the memory cell, and
   the read voltage generator generates the read voltage based on the monitor voltage.

2. The nonvolatile memory device according to claim 1, wherein
   the read reference current generator includes a current mirror circuit that generates the read reference current based on the constant current from the constant current generator,
   a dummy transistor forming the current mirror circuit has the same structure as a transistor forming the memory cell, and
   the monitor voltage is a gate-source voltage of the dummy transistor.

3. The nonvolatile memory device according to claim 1, wherein the read reference current generator comprises:
   a first current mirror circuit that generates the read reference current based on the constant current from the constant current generator;
   a dummy transistor that has the same structure as a transistor forming the memory cell, a gate-source voltage of the dummy transistor being the monitor voltage; and
   a second current mirror circuit that supplies the constant current from the constant current generator to the dummy transistor.

4. The nonvolatile memory device according to claim 1, wherein the memory cell is a flash memory.

5. The nonvolatile memory device according to claim 1, wherein the memory cell is an EEPROM (Electrically Erasable and Programmable Read Only Memory).

6. The nonvolatile memory device according to claim 1, wherein the read voltage generator generates the read voltage by amplifying the monitor voltage using a non-inverting amplifier.

* * * * *